(12) United States Patent
Bai

(10) Patent No.: US 10,604,833 B2
(45) Date of Patent: Mar. 31, 2020

(54) METAL MASK PLATE AND FABRICATION METHOD THEREOF

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventor: Shanshan Bai, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 278 days.

(21) Appl. No.: 15/510,464

(22) PCT Filed: Aug. 3, 2016

(86) PCT No.: PCT/CN2016/093074
§ 371 (c)(1),
(2) Date: Mar. 10, 2017

(87) PCT Pub. No.: WO2017/117999
PCT Pub. Date: Jul. 13, 2017

(65) Prior Publication Data
US 2018/0230585 A1 Aug. 16, 2018

(30) Foreign Application Priority Data
Jan. 6, 2016 (CN) .......................... 2016 1 0007307

(51) Int. Cl.
C23C 14/04 (2006.01)
C23C 14/24 (2006.01)
(Continued)

(52) U.S. Cl.
CPC ............ *C23C 14/042* (2013.01); *C23C 14/24* (2013.01); *C23F 1/14* (2013.01); *H01L 51/0011* (2013.01)

(58) Field of Classification Search
CPC ......... C23C 14/042; C23C 14/24; C23F 1/14; H01L 1/14
See application file for complete search history.

(56) References Cited

U.S. PATENT DOCUMENTS

2012/0279444 A1 11/2012 Hong
2015/0040826 A1* 2/2015 Jung .......................... C23F 1/02
118/504

(Continued)

FOREIGN PATENT DOCUMENTS

CN 102766841 A 11/2012
CN 103668056 A 3/2014

(Continued)

OTHER PUBLICATIONS

International Search Report dated Nov. 2, 2016; PCT/CN2016/093074.

(Continued)

*Primary Examiner* — Kelly M Gambetta

(57) ABSTRACT

A metal mask plate and a fabrication method thereof. The metal mask plate has a first main surface and a second main surface opposite to each other, the metal mask plate includes: a plurality of panel-defining regions spaced apart; and a main frame portion. In each of the panel-defining regions, a plurality of via holes configured for defining a pixel structure are arranged in a matrix, and each of the via holes communicates the first main surface and the second main surface of the metal mask plate, side walls of every two adjacent via holes are directly connected with each other on the second main surface of the metal mask plate so that the metal mask plate between the two adjacent via holes (101)

(Continued)

in the panel-defining region has a thickness D1. The main frame portion of the metal mask plate has a second thickness D2, and the first thickness D1 and the second thickness D2 satisfy $|D1-D2|/D1 \leq 20\%$. Thus, a wrinkle and deformation caused by the difference of the thicknesses during unfolding can be effectively avoid, so as to further effectively improve quality of the OLED display product fabricated by adopting the fine metal mask plate.

19 Claims, 7 Drawing Sheets

(51) Int. Cl.
*C23F 1/14* (2006.01)
*H01L 51/00* (2006.01)

(56) References Cited

U.S. PATENT DOCUMENTS

| | | | |
|---|---|---|---|
| 2015/0068455 A1* | 3/2015 | Lee | B05C 21/005 118/504 |
| 2018/0230585 A1 | 8/2018 | Bai | |

FOREIGN PATENT DOCUMENTS

| | | |
|---|---|---|
| CN | 203559114 U | 4/2014 |
| CN | 103911583 A | 7/2014 |
| CN | 203834004 U | 9/2014 |
| CN | 104120380 A | 10/2014 |
| CN | 104846328 A | 8/2015 |
| CN | 204825028 U | 12/2015 |
| CN | 105568217 A | 5/2016 |
| EP | 1209522 A2 | 5/2002 |
| JP | 2001-237071 A | 8/2001 |
| JP | 2003-272838 A | 9/2003 |
| JP | 2012-111985 A | 6/2012 |

OTHER PUBLICATIONS

Written Opinion dated Nov. 2, 2016; PCT/CN2016/093074.
International Preliminary Report on Patentability dated Jul. 10, 2018; PCT/CN2016/093074.
The First Chinese Office Action dated Aug. 2, 2017; Appln. 201610007307.3.

* cited by examiner

METAL MASK PLATE AND FABRICATION METHOD THEREOF

TECHNICAL FIELD

Embodiments of the present disclosure relate to a metal mask plate and a fabrication method thereof.

BACKGROUND

An Organic Light Emitting Diode (OLED) is an organic thin film electroluminescent device, which has advantages such as easiness to form a flexible structure and a wide viewing angle. Therefore, a display technology using the organic light-emitting diode has become an important display technology.

OLED full color display generally adopts a mode in which R (red) G (green) B (blue) sub-pixels emit light independently, or a mode in which a white OLED is combined with a color filter film, and so on. The mode in which the RGB sub-pixels emit light independently is a widely used color mode at present, especially used in independent light emission of an organic light-emitting material in a pixel unit. In an OLED display technology, a mask used in a vacuum evaporation process is essential, and quality of the mask directly affects production costs and product quality. With development of a high-resolution OLED display product, a thickness of a metal mask plate used for fabricating an organic light-emitting display panel is gradually reduced while a size thereof is gradually increased, and extremely slightly uneven stress will even cause deformation. Particularly, in a process of unfolding and assembling the metal mask plate, if a tension applied to the metal mask plate is too small, the metal mask plate may be severely saggy; if the tension is increased, the metal mask plate may be stretched, resulting in distortion and a wrinkle. At present, a Fine Metal mask plate (FMM) has become a main cause of problems such as color mixing and brightness unevenness, which greatly restricts the development of an AMOLED product.

SUMMARY

At least one embodiment of the present disclosure provides a metal mask plate configured for fabricating an organic light-emitting display panel, having a first main surface and a second main surface opposite to each other, the metal mask plate comprising: a plurality of panel-defining regions spaced apart; and a main frame portion, surrounding each of the panel-defining regions and connecting the plurality of panel-defining regions, wherein, in each of the panel-defining regions, a plurality of via holes configured for defining a pixel structure are arranged in a matrix, and each of the via holes communicates the first main surface and the second main surface of the metal mask plate, side walls of every two adjacent via holes are directly connected with each other on the second main surface of the metal mask plate so that the metal mask plate between the two adjacent via holes in the panel-defining region has a thickness D1, the main frame portion has a second thickness D2, and the first thickness D1 and the second thickness D2 satisfy $|D1-D2|/D1 \leq 20\%$.

For example, in a metal mask plate provided by an embodiment of the present disclosure, the first thickness D1 is equal to the second thickness D2.

For example, A metal mask plate provided by an embodiment of the present disclosure further comprising: a bonding portion provided coplanar with the main frame portion and connected with at least two opposite sides of the main frame portion, the bonding portion being configured for unfolded fixing the metal mask plate onto a support mechanism, and a thickness of the bonding portion being equal to the second thickness D2 of the main frame portion.

For example, in a metal mask plate provided by an embodiment of the present disclosure, both the first thickness D1 and the second thickness D2 are within a range of 5 µm to 40 µm.

For example, in a metal mask plate provided by an embodiment of the present disclosure, both the first thickness D1 and the second thickness D2 are within a range of 10 µm to 25 µm.

For example, in a metal mask plate provided by an embodiment of the present disclosure, each of the via holes in the metal mask plate forms a first opening and a second opening on the first main surface and the second main surface of the metal mask plate respectively, and an area of the second opening is larger than an area of the first opening.

For example, in a metal mask plate provided by an embodiment of the present disclosure, each of the via holes is formed by a first sub-via hole on a first main surface side and a second sub-via hole on a second main surface side which are coincided and communicated, and in a direction perpendicular to the metal mask plate and from the second main surface to the first main surface, a hole diameter of the first sub-via hole gradually increases and a hole diameter of the second sub-via hole gradually decreases.

At least one embodiment of the present disclosure provides a fabrication method of a metal mask plate, the metal mask plate being configured for fabricating an organic light-emitting display panel, the method comprising steps of: providing a metal substrate, having a first main surface side and a second main surface side opposite to each other, wherein, the metal substrate is divided into a plurality of panel-defining regions spaced apart and a main frame region surrounding each of the panel-defining regions and connecting the plurality of panel-defining regions; forming a plurality of via holes communicating the first main surface side and the second main surface side of the metal substrate in the metal substrate; and adjusting a thickness of the main frame region of the metal substrate, wherein, in each of the panel-defining regions, the plurality of via holes is arranged in a matrix, and side walls of every two adjacent via holes are directly connected with each other on the second main surface side of the metal substrate so that a thickness D1 of the metal substrate between the two adjacent via holes is formed to be smaller than a thickness D1' defined by the panel-defining region when the via holes begins to be formed, and a thickness of the main frame region of the metal substrate is adjusted so that a thickness D2 of the main frame region after adjustment satisfies $|D1-D2|/D1 \leq 20\%$.

For example, in a fabrication method provided by an embodiment of the present disclosure, the thickness D2 of the main frame region after adjustment satisfies $|D1-D2|/D1 \leq 5\%$.

For example, in a fabrication method provided by an embodiment of the present disclosure, the thickness D2 of the main frame region after adjustment is equal to the thickness D1 of the metal substrate between two adjacent via holes.

For example, in a fabrication method provided by an embodiment of the present disclosure, an original thickness of the panel-defining region is equal to an original thickness of the main frame region, and both are larger than or equal to 30 microns.

For example, in a fabrication method provided by an embodiment of the present disclosure, the thickness D1 of the metal substrate between every two adjacent via holes is formed to be 33% to 75% of the thickness D1' of the panel-defining region when the via hole begins to be formed.

For example, in a fabrication method provided by an embodiment of the present disclosure, the step of adjusting a thickness of the main frame region of the metal substrate is performed by thinning the main frame portion of the metal substrate, after forming a plurality of via holes communicating the first main surface and the second main surface of the metal substrate in the metal substrate, so that the main frame region has the thickness D2 after the thinning.

For example, in a fabrication method provided by an embodiment of the present disclosure, the main frame region is adjusted to have the thickness D2 before formation of the plurality of via holes.

For example, in a fabrication method provided by an embodiment of the present disclosure, the via hole forms a first opening and a second opening respectively on the first main surface and the second main surface of the metal substrate, and an area of the second opening is larger than an area of the first opening.

For example, in a fabrication method provided by an embodiment of the present disclosure, the plurality of via holes is formed by a chemical solution double-face etching method.

For example, in a fabrication method provided by an embodiment of the present disclosure, each of the via holes is formed by coinciding and communicating a first sub-via hole on the first main surface side and a second sub-via hole on the second main surface side, and in a direction perpendicular to the metal mask plate and from the second main surface to the first main surface, a hole diameter of the first sub-via hole gradually increases and a hole diameter of the second sub-via hole gradually decreases.

At least one embodiment of the present disclosure provides a fabrication method of a metal mask plate, wherein, the metal mask plate is designed to comprise a plurality of via holes that communicate a first main surface and a second main surface opposite to each other, the metal mask plate is divided into a plurality of panel-defining regions spaced apart and a main frame portion surrounding each of the panel-defining regions and connecting the plurality of panel-defining regions, in each panel-defining region, the plurality of via holes is arranged in a matrix, and side walls of every two adjacent via holes are directly connected with each other on the second main surface of the metal substrate, the fabrication method comprising steps of: obtaining a target thickness D10 of the metal mask plate between two adjacent via holes in the panel-defining region; providing a metal substrate to form the metal mask plate, wherein a portion of the metal substrate for forming the main frame portion of the metal mask plate has a thickness D0, the thickness D0 and a thickness D10 satisfy |D1−D2|/D1≤20%; and forming the plurality of via holes in the metal substrate.

For example, in a fabrication method provided by an embodiment of the present disclosure, the via hole forms a first opening and a second opening on the first main surface and the second main surface of the metal substrate respectively, and an area of the second opening is larger than an area of the first opening.

For example, in a fabrication method provided by an embodiment of the present disclosure, the target thickness D10 of the metal mask plate between two adjacent via holes is obtained according to formula $$D1_0 = \frac{a \times \tan\theta}{2} + b,$$

where, a is a maximum transverse distance between the sidewalls, opposite to each other, of the two adjacent via holes in a cross section, the cross section is perpendicular to the metal mask plate and passes through centers of the two adjacent via holes; θ is a minimum incident angle by which the via hole allows to pass through, and b is a vertical distance from a position where a hole diameter of the via hole is the smallest to the first main surface.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

Figure 1:
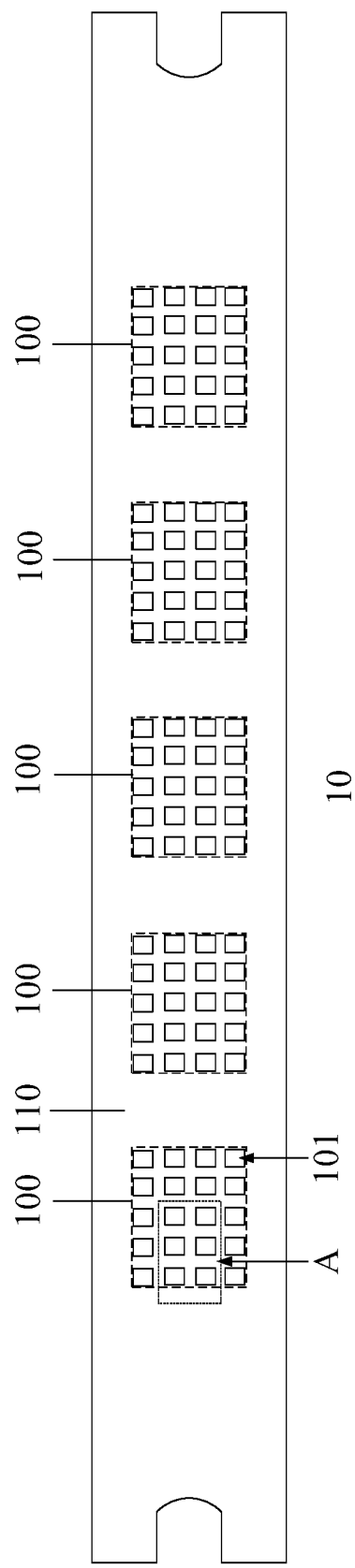
FIG. 1 is a schematic top view of a metal mask plate in a related art.

Hereinafter, the technical solutions of the embodiments of the present disclosure will be described in a clearly and fully understandable way in conjunction with the drawings related to the embodiments of the present disclosure; with reference to non-restrictive exemplary embodiments shown in the drawings and described in detail in the following description, exemplary embodiments of the present disclosure and their various features and favorable details are illustrated more comprehensively. It should be noted that, the features shown in the drawings are not necessarily drawn according to scale. Known materials, components and process technologies have not been described so as not to obscure the exemplary embodiments of the present disclosure. Examples are merely intended to facilitate understanding of implementation of exemplary embodiments of the present disclosure, and further enable those skilled in the art to implement the exemplary embodiments. Therefore, the examples should not be construed as limiting the scope of the exemplary embodiments of the present disclosure.

Unless otherwise defined, technical terms or scientific terms used in the present disclosure should be of general meaning as understood by those ordinarily skilled in the art. "First", "second" and similar words used in the present disclosure do not represent any sequence, quantity or importance and merely intend to differentiate different composite parts. Words such as "up", "down", "left", "right" and the like are only used for expressing relative positional relationship, when the absolute position is a described object is changed, the relative positional relationship may also be correspondingly changed. In addition, in respective embodiments of the present disclosure, same or similar reference signs denote same or similar parts.

For an OLED in which RGB sub-pixels emit light independently, since the respective RGB sub-pixel units adopt different organic light-emitting materials, organic light-emitting layers of the RGB sub-pixel units need to be evaporated separately. In this evaporation process, a Fine Metal mask plate (FMM) is generally used for controlling a position of the organic light-emitting material to coat a film on a substrate, so as to evaporate a pixel pattern of a corresponding organic light-emitting material in each sub-pixel unit. A high-resolution OLED display product puts forward very high requirement on accuracy of the FMM.

Figure 2:
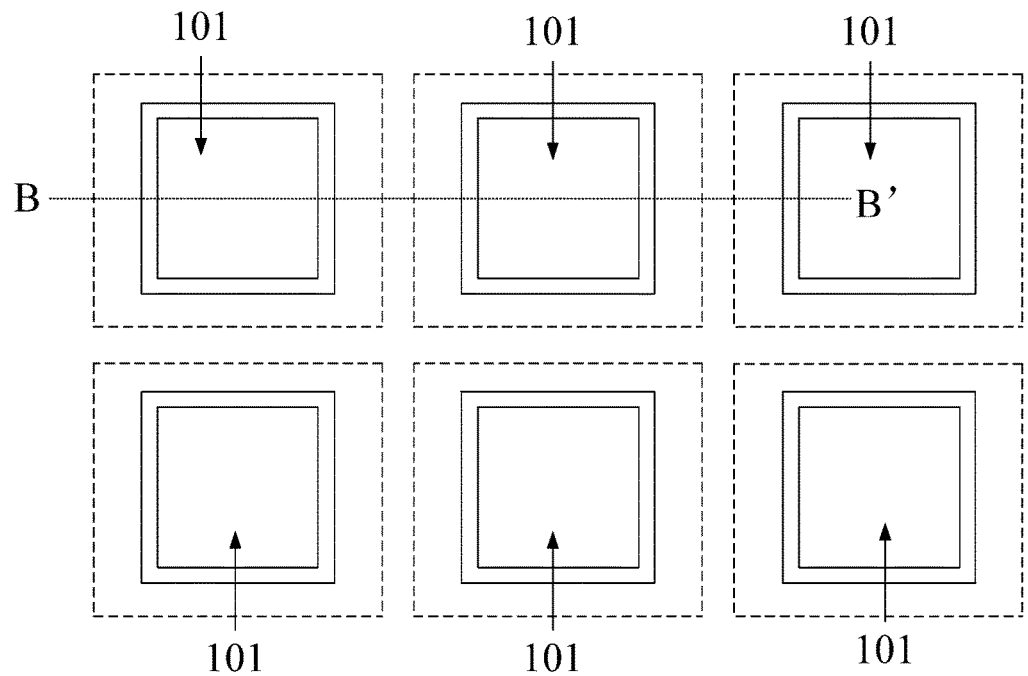
FIG. 2 is an amplified schematic diagram of a region A in the metal mask plate shown in FIG. 1.
Figure 3A:
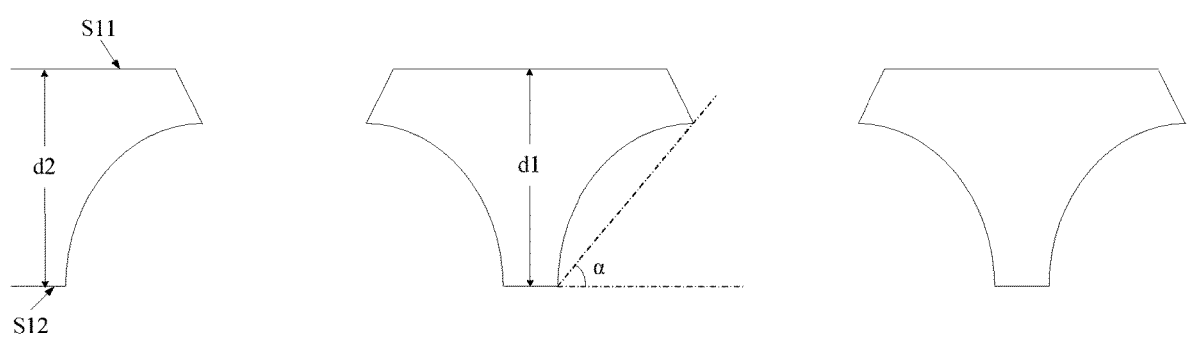
FIG. 3A is a cross-sectional schematic diagram of the metal mask plate along a line B-B' in FIG. 2.

FIG. 1, FIG. 2, FIG. 3A and FIG. 3B show a fine metal mask plate 10 for fabricating a slot type of an organic light-emitting display panel in a related art. FIG. 1 is a top view of the metal mask plate; FIG. 2 is an amplified schematic diagram of a region A in FIG. 1; and FIG. 3A is a cross-sectional schematic diagram along a line B-B' in FIG. 2;

The metal mask plate 10 has a first main surface S11 and a second main surface S12 opposite to each other (i.e., an upper surface and a lower surface in the figures). The metal mask plate 10 includes a plurality of panel-defining regions 100 spaced apart and a main frame portion 110. The main frame portion 110 surrounds each of the panel-defining regions 100 and connects all of the panel-defining regions 100. In each panel-defining region 100, a plurality of via holes 101 for defining a pixel structure are arranged in a matrix, and each via hole 101 communicates the first main surface S11 and the second main surface S12 of the metal mask plate 10.

The second main surface S12 of the fine metal mask plate 10 shown in FIG. 3 is designed, for example, to be an evaporation surface facing an evaporation source. For example, in a vacuum evaporation process, an evaporation source (for example, a crucible carrying an organic material) is provided below the fine metal mask plate 10 shown in FIG. 3, a deposition substrate (e.g., an OLED array substrate onto which an organic light-emitting layer to be deposited by evaporation) is provided above the fine metal mask plate 10 shown in FIG. 3. The OLED array substrate may be provided with, for example, a gate line, a data line, a power supply line, and a pixel circuit structure such as a switch transistor and a driving transistor. The organic material is evaporated and diffused, passing through respective via holes 101 to be deposited on the deposition substrate located above to form a predetermined pattern.

In order to increase a utilization rate of the organic material and to avoid a shielding effect, the via hole 101 in the fine metal mask plate is designed so that a size of the opening formed on an evaporation surface—the second main surface S12—is larger than that of an opening formed on a side opposite thereto—the first main surface S11, so that the via hole 101 allows an evaporated material particle having an incident angle larger than an angle $\alpha$ to pass through. Here, the incident angle refers to an acute angle formed between an incident direction of the evaporation material particle and the evaporation surface S12 of the fine metal mask plate. The angle $\alpha$ refers to a minimum incident angle through which the via hole 101 allows to pass. The angle $\alpha$ is related to an evaporation angle of an evaporation machine. In general, the smaller the angle $\alpha$, the more favorable to increase the utilization rate of the organic material and to avoid the shielding effect.

Figure 3B:
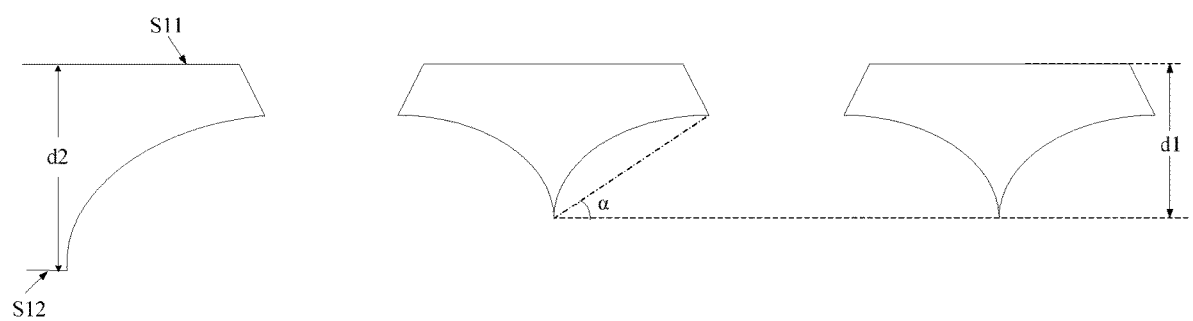
FIG. 3B is a cross-sectional schematic diagram of the metal mask plate in the related art.

In research, the inventor finds that: a thickness of the fine metal mask plate used for a high-resolution product is relatively small and a gap between adjacent via holes 101 is very small. In this case, in order to ensure a relatively small angle $\alpha$, openings formed on the evaporation surface S12 by two adjacent via holes 101 are connected, as a result. Furthermore, a thickness d1 of the fine metal mask plate finally formed between the two adjacent via holes 101 is only 33% to 75% of a thickness d2 of the main frame portion 110, as shown in FIG. 3B. Since the thickness d1 and the thickness d2 differ too greatly, the fine metal mask plate is likely to be wrinkled and deformed during unfolding, which further results in problems such as inaccurate pixel alignment, screen color mixing and uneven brightness in the OLED display product fabricated by adopting the fine metal mask plate.

The metal mask plate and the fabrication method thereof provided by the embodiments of the present disclosure can effectively avoid a wrinkle and deformation caused by the difference of the thicknesses during unfolding, so as to further effectively improve quality of the OLED display product fabricated by adopting the fine metal mask plate.

Figure 4:
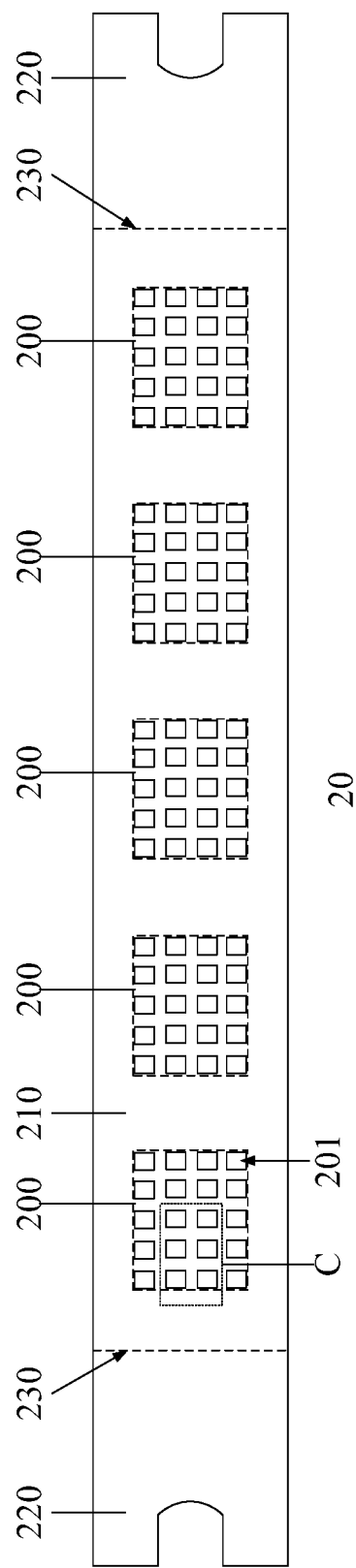
FIG. 4 is a schematic top view of a metal mask plate provided by an embodiment of the present disclosure.
Figure 5:
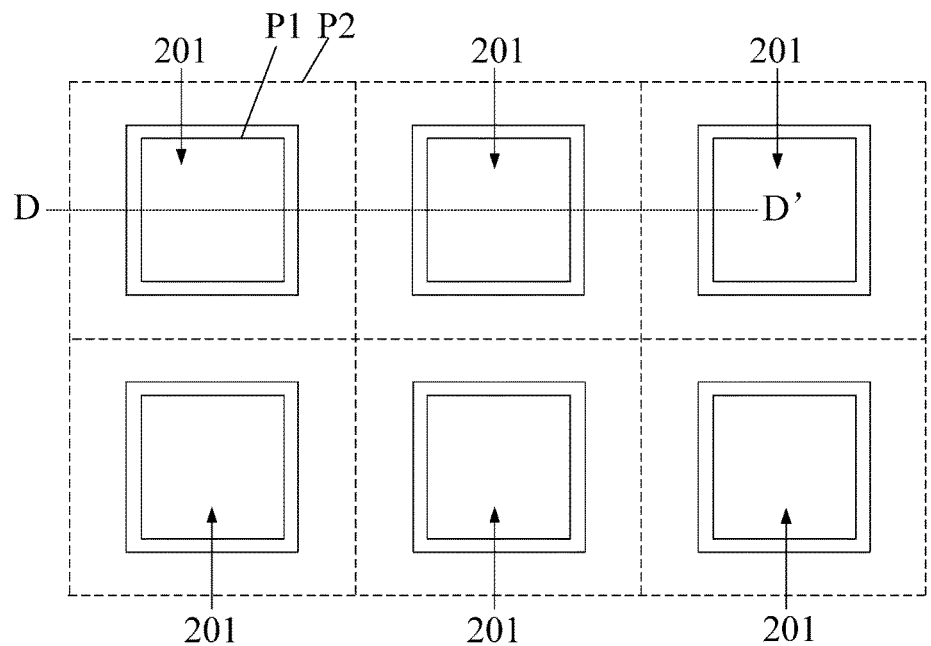
FIG. 5 is an amplified schematic diagram of a region C in the metal mask plate in FIG. 4.

Hereinafter, a fine metal mask plate 20 for fabricating an organic light-emitting display panel provided by the embodiment of the present disclosure will be described with reference to FIG. 4, FIG. 5 and FIG. 6. FIG. 4 is a schematic top view of a metal mask plate provided by an embodiment of the present disclosure; FIG. 5 is an amplified schematic diagram of a region C in the metal mask plate shown in FIG. 4; and FIG. 6 is a cross-sectional schematic diagram of the metal mask plate along a line D-D' in FIG. 5.

The metal mask plate 20 has a first main surface S21 and a second main surface S22 opposite to each other. The metal mask plate 20 includes a plurality of panel-defining regions 200 spaced apart and a main frame portion 210 surrounding the respective panel-defining regions 200 and connecting all the panel-defining regions 200. Here, each of the panel-defining regions 200 is, for example, configured for forming a corresponding structure of an effective display region of one OLED display panel. In FIG. 4, the plurality of panel-defining regions 200 is respectively shown in dashed rectangular boxes. In an example, the main frame portion 210 may be understood as a frame structure of the metal mask plate 20 outside the plurality of panel-defining regions 200. For example, an outer edge of the main frame portion 210 constitutes an outer edge of the metal mask plate 20. In this embodiment, the main frame portion 210 has an outer edge E of a rectangular shape.

In each panel-defining region 200, a plurality of via holes 201 configured for defining pixel structures is arranged in a matrix. Each of the via holes 201 communicates the first main surface S21 and the second main surface S22 of the metal mask plate 20. In FIG. 4, the via holes 201 in each panel-defining region 200 form a matrix of 4 rows and 5 columns. The dashed rectangular boxes representing the panel-defining region 200 is substantially coincident with, for example, an outer boundary of the via holes at the most peripheral edge in the matrix of 4 rows and 5 columns. Herein, the respective via holes 201 in a matrix of 4 rows and 5 columns are adopted, for example, to form corresponding structures of the respective pixels in a same OLED display panel by evaporating. For example, the respective via holes 201 in the matrix of 4 rows and 5 columns are adopted to form organic light-emitting layers or functional layers (e.g., an electron transport layer or a hole transport layer) of the respective pixels in a same OLED display panel by evaporating. It is understood that, here the via hole matrix of 4 rows and 5 columns is only exemplary, and those skilled in the art can determine the number of rows and the number of columns of the via hole matrix according to designed pixels of a display panel to be fabricated.

Figure 6:
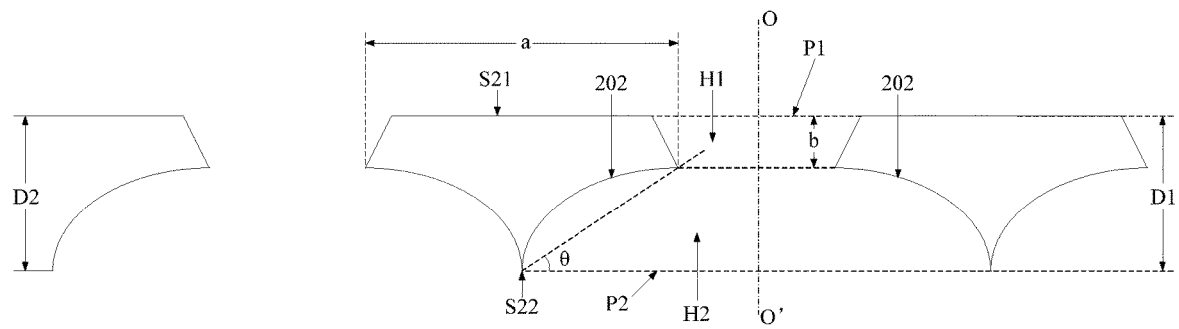
FIG. 6 is a cross-sectional schematic diagram of the metal mask plate along a line D-D' in FIG. 5.

In the metal mask plate 20 provided by this embodiment, with reference to FIG. 6, the main frame portion 210 of the metal mask plate 20 has a second thickness D2. Side walls 202 of every two adjacent via holes 201 are directly connected with each other on the side of the second main surface S22 of the metal mask plate 20 so that the metal mask plate 20 between the two adjacent via holes 201 in the panel-defining region 200 has a first thickness D1. In other words, second openings P2 of every two adjacent via holes 201 formed on the second main surface S22 are connected with each other. For example, the first thickness D1 of the metal mask plate 20 between the two adjacent via holes 201 in the panel-defining region 200 and the second thickness D2 of the main frame portion 210 satisfies $|D1-D2|/D1 \le 20\%$.

In this way, since difference between the thickness between the two adjacent via holes 201 in the panel-defining region 200 of the metal mask plate 20 and the thickness of the main frame portion 210 is within a range defined by the above formula, it is possible to effectively avoid a wrinkle and deformation caused by the difference of the thicknesses during unfolding, so as to further effectively improve quality of the OLED display product fabricated by the fine metal mask plate.

For example, the metal mask plate 20 is made of a material which may include stainless steel, nickel, nickel-cobalt alloy, Invar alloy, etc. and specific material(s) is not limited by the embodiment of the present disclosure.

For example, in an example, the first thickness D1 of the metal mask plate 20 between the two adjacent via holes 201 in the panel-defining region 200 and the second thickness D2 of the main frame portion 210 satisfy $|D1-D2|/D1 \le 5\%$; and further, in another example, the first thickness D1 of the metal mask plate 20 between the two adjacent via holes 201 in the panel-defining region 200 is equal to the second thickness D2 of the main frame portion 210. Here, "equal to" allows, for example, a fabrication tolerance within 1%. In the above examples, a further reduction in the difference between the first thickness D1 and the second thickness D2 may be more advantageous to avoid the wrinkle and the deformation caused by thickness difference during webbing, so as to further effectively improve quality of the OLED display product fabricated with the fine metal mask plate.

For example, as shown in FIG. 4, the metal mask plate 20 provided by the embodiment of the present disclosure further includes: a bonding portion 220 provided coplanar with the main frame portion 210 and connected with at least two opposite sides of the main frame portion 210. A thickness of the bonding portion 220 is, for example, equal to the second thickness D2 of the main frame portion 210. Here, "equal to" allows, for example, a fabrication tolerance within 1%. For example, a cutting line 230 is provided between the bonding portion 220 and the main frame portion 210, the bonding portion 220 is configured for unfolding and placing the metal mask plate 20 on a support mechanism, then the metal mask plate 20 is fixed to the support mechanism by, for example, welding or attaching, and thereafter, the bonding portion 220 can be cut along the cutting line 230 by, for example, mechanical cutting or laser cutting.

For example, as shown in FIG. 4, the respective panel-defining regions 200 are connected with the main frame portion 210. The plurality of panel-defining regions 200 and the main frame portion 210 are combined together to form a rectangular region. Further, the main frame portion 210 is an entire region between the two bonding portions 220 (or between the two cutting lines 230) of the metal mask plate 20 excluding the plurality of panel-defining regions 200.

For example, in the metal mask plate 20 provided by the embodiment of the present disclosure, both the first thickness D1 and the second thickness D2 are within a range of 5 μm to 40 μm.

For example, in the metal mask plate 20 provided by the embodiment of the present disclosure, both the first thickness D1 and the second thickness D2 are within a range of 10 μm to 25 μm.

The second main surface S22 of the metal mask plate 20 shown in FIG. 6 is, for example, designed to be an evaporation surface facing to an evaporation source. For example, in the vacuum evaporation process, an evaporation source (for example, a crucible carrying an organic material) is provided below the metal mask plate 20 shown in FIG. 6, a deposition substrate (e.g., an OLED array substrate onto which an organic light-emitting layer is to be deposited by evaporation) is provided above the metal mask plate 20 shown in FIG. 6. The OLED array substrate may be provided with, for example, a gate line, a data line, a power supply line, and a pixel circuit structure such as a switch transistor and a driving transistor. The organic material is evaporated and diffused, passing through the respective via holes 201 to be deposited onto the deposition substrate located above to form a predetermined pattern.

In this embodiment, each via hole 201 in the metal mask plate forms the first opening P1 and the second opening P2 which are rectangular on the first main surface S21 and the second main surface S22 of the metal mask plate 20 which are opposite to each other, respectively, as shown in FIG. 5 and FIG. 6. A size of the opening P2 formed on the evaporation surface S22 of the via hole 201 is larger than a size of the opening P1 formed on a surface S21 opposite thereto. For example, with reference to FIG. 6, each via hole 201 is formed by coinciding and communicating a first sub-via hole H1 on a side of the first main surface S21 and a second sub-via hole H2 on a side of the second main surface S22. For example, in FIG. 6, in an upward direction perpendicular to the metal mask plate 20, a hole diameter of the first sub-via hole H1 gradually increases and a hole diameter of the second sub-via hole H2 gradually decreases, so that a hole diameter of the via hole 201 firstly decreases and then increases in the direction. Each via hole 201 is formed, for example, in a shape symmetrical with respect to an axis OO', as shown in FIG. 6, the axis OO' is, for example, a center line of the via hole 201. The plurality of via holes 201 in this embodiment may be formed, for example, by a chemical solution double-face etching method.

Figure 7:
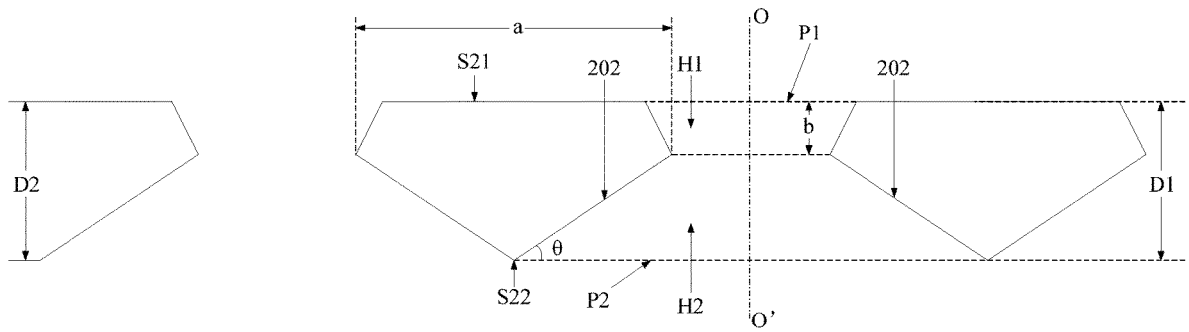
FIG. 7 is a cross-sectional schematic diagram of another example of the metal mask plate provided by the embodiment of the present disclosure.

FIG. 7 is another example of the metal mask plate 20 provided by an embodiment of the present disclosure. In the cross-sectional view of FIG. 7, each via hole 201 in the metal mask plate forms the first opening P1 and the second opening P2 which are rectangular on the first main surface S21 and the second main surface S22 of the metal mask plate 20 opposite to each other, respectively. A size of the opening P2 formed on the evaporation surface S22 of the via hole 201 is larger than a size of the opening P1 formed on a surface S21 opposite thereto. For example, with reference to FIG. 7, each via hole 201 is formed by coinciding and communicating the first sub-via hole H1 on a side of the first main surface S21 and the second sub-via hole 112 on a side of the second main surface S22. For example, in FIG. 7, in the upward direction perpendicular to the metal mask plate 20, the hole diameter of the first sub-via hole H1 gradually increases and the hole diameter of the second sub-via hole H2 gradually decreases, so that the hole diameter of the via hole 201 firstly decreases and then increases in the direction. Each via hole 201 is formed, for example, in a shape symmetrical with respect to the axis OO', as shown in FIG. 7, the axis OO' is, for example, the center line of the via hole 201. The first sub-via hole H1 and the second sub-via hole H2, for example, both have a trapezoidal cross section. The plurality of via holes 201 shown in FIG. 7 may be formed, for example, by laser cutting, wherein, laser cutting is a process of making a laser cutting head that emits laser to travel according to a predetermined position and direction, so as to cut a desired shape.

Figure 8:
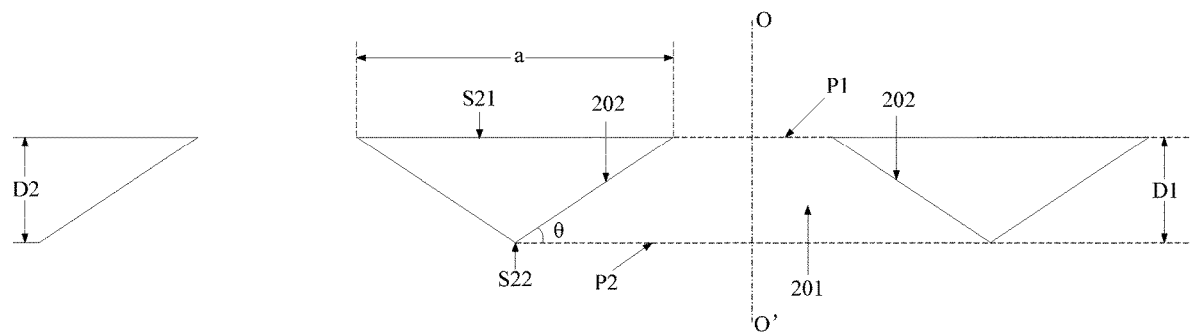
FIG. 8 is a cross-sectional schematic diagram of still another example of the metal mask plate provided by the embodiment of the present disclosure.

FIG. 8 shows another example of the metal mask plate 20 provided by the embodiment of the present disclosure. In the cross-sectional view of FIG. 8, each via hole 201 in the metal mask plate forms the first opening P1 and the second opening P2 which are rectangular on the first main surface S21 and the second main surface S22 of the metal mask plate 20 opposite to each other, respectively. A size of the opening P2 formed on the evaporation surface S22 of the via hole 201 is larger than a size of the opening P1 formed on a surface S21 opposite thereto. Each via hole 201 is formed to have a trapezoidal cross section as a whole and is symmetrical about the center line OO', as shown in FIG. 8. In FIG. 8, in the upward direction perpendicular to the metal mask plate 20, the hole diameter of the via hole 201 gradually decreases. The plurality of via holes 201 shown in FIG. 8 can be formed, for example, by laser cutting.

With further reference to FIG. 6 to FIG. 8, the via hole 201 is formed to allow an evaporation material particle having an incident angle larger than an angle $\theta$ to pass through. Here, the incident angle refers to an acute angle formed between an incident direction of the evaporation material particle and the evaporation surface S22 of the metal mask plate. The angle $\theta$ refers to a minimum incident angle through which the via hole 101 allows to pass. To understand in conjunction with FIG. 6 to FIG. 8, the angle $\theta$ refers to, for example, an angle formed between the second main surface S22 and a connection line of from a position at the smallest hole diameter of the via hole 201 in the cross section to a connection position of two adjacent via holes 201 on the second main surface S22. A value of the angle $\theta$ may be set according to an evaporation angle of an evaporation machine. For example, the angle $\theta$ is within a range of 12° to 30°.

The fine metal mask plate 20 provided by the embodiment of the present disclosure can have a relatively thin and uniform thickness and a relatively small minimum incident angle $\theta$ at the same time, so that a high-resolution OLED display product of high quality can be fabricated.

Figure 9:
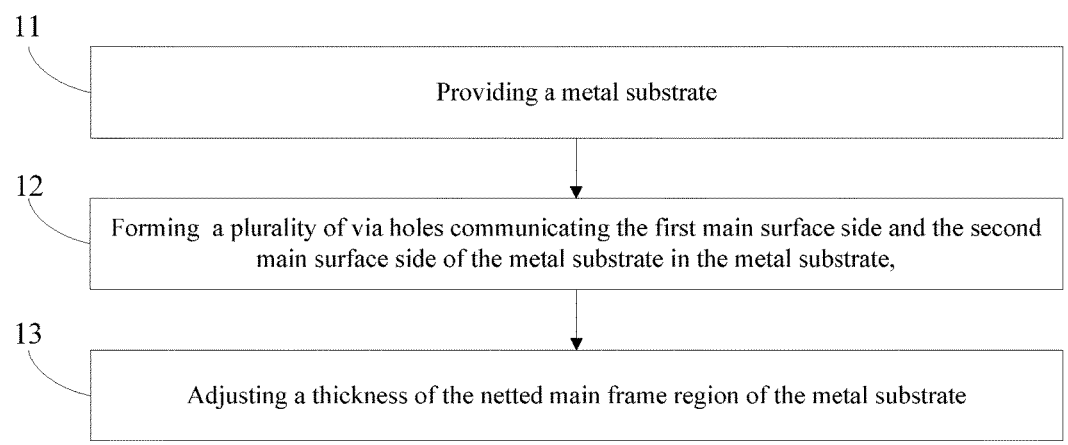
FIG. 9 is a flow chart of a fabrication method of a metal mask plate provided by an embodiment of the present disclosure.

Another embodiment of the present disclosure further provides a fabrication method of a metal mask plate, the metal mask plate being configured for fabricating an organic light-emitting display panel. For example, the fabrication method of the metal mask plate is described by taking the metal mask plate shown in FIG. 4, FIG. 5 and FIG. 6 in the first embodiment as an example. As shown in FIG. 9, the method comprises steps of:

Step 11: providing a metal substrate.

The metal substrate has a first main surface side and a second main surface side opposite to each other. The metal substrate can be divided into a plurality of panel-defining regions spaced apart and a main frame region surrounding each panel-defining region and connecting all of the panel-defining regions. Here, the panel-defining region of the metal substrate is configured for forming the panel-defining region 200 of the metal mask plate 20, and the main frame region of the metal substrate is configured for forming a main frame portion 210 of the metal mask plate 20. In this embodiment, the metal substrate has, for example, a uniform thickness. For example, an original thickness of the respective panel-defining regions of the metal substrate is equal to an original thickness of the main frame region. It can be understood that, the embodiment of the present disclosure is not limited thereto, and in other examples, the original thickness of respective panel-defining regions of the metal substrate can be set to be different from the original thickness of the main frame region. The original thickness of the respective panel-defining regions of the metal substrate and the original thickness of the main frame region are both, for example, larger than or equal to 30 microns.

Step 12: forming a plurality of via holes communicating the first main surface side and the second main surface side of the metal substrate in the metal substrate.

The plurality of via holes is, for example, the via holes 201 as shown in FIG. 4 to FIG. 8 of the present disclosure. In each panel-defining region of the metal substrate, the plurality of via holes 201 are arranged in a matrix, side walls 202 of every two adjacent via holes 201 are directly connected with each other on the second main surface side of the metal substrate, so that a first thickness D1 of the metal substrate between every two adjacent via holes 201 is formed to be smaller than a thickness D1' of the panel-defining region of the metal substrate when the via hole 201 begins to be formed. For example, the thickness D1' of the panel-defining region of the metal substrate when the via hole 201 begins to be formed is the original thickness of the panel-defining region of the metal substrate. For example, the thickness D1 of the metal substrate between every two adjacent via holes 201 is formed to be 33% to 75% of the thickness D1' of the panel-defining region of the metal substrate when the via hole 201 begins to be formed.

Step 13: adjusting a thickness of the main frame region of the metal substrate, so that a thickness D2 of the main frame region after adjustment satisfies $|D1-D2|/D1 \leq 20\%$.

For example, in this embodiment, after the step 12 is performed to form the plurality of via holes 201, the step 13 is performed to adjust the thickness of the main frame region of the metal substrate. In this embodiment, since the original thickness of the panel-defining region of the metal substrate provided is equal to the original thickness of the main frame region, the thickness D1 of the metal substrate between every two adjacent via holes 201 is also formed to be 33% to 75% of the thickness of the main frame region of the metal substrate after the step 12 is performed to form the plurality of via holes 201. At this time, the adjusting a thickness of the main frame region of the metal substrate can be implemented by, for example, an etching process. For example, after the step 12 is performed, a photoresist pattern on the second main surface side of the metal substrate to cover all of the panel-defining regions and expose the main frame region is formed; then, the second main surface side of the metal substrate covered by the photoresist pattern is immersed in a chemical etching solution, to reduce the thickness of the exposed main frame region. Alternatively, the thickness of the exposed main frame region may also be reduced by dry etching.

It is understood that, the embodiment of the present disclosure is not limited to the order of step 12 and step 13. For example, in another example, before the step 12 of forming the via holes 201, the step 13 of adjusting a thickness of the main frame region of the metal substrate can be executed. For example, before the step 12 of forming the via holes 201, the thickness of the main frame region of the metal substrate with a uniform thickness is adjusted to D2 by a forging and forming process, and the thickness of each panel-defining region is adjusted to D1'. Next, the step of forming the via holes 201 begins to be executed. In this way, the thickness of the panel-defining region of the metal substrate when the via hole 201 begins to be formed is adjusted to the thickness D1' of the panel-defining region of the metal substrate by the forging and forming process.

For example, in the fabrication method of the metal mask plate 20 provided by the embodiment of the present disclosure, the thickness D2 of the main frame portion 210 after adjustment satisfies $|D1-D2|/D1 \leq 5\%$.

For example, in the fabrication method of the metal mask plate 20 provided by the embodiment of the present disclosure, the thickness D2 of the main frame portion 210 after adjustment is equal to the thickness D1 of the metal substrate between every two adjacent via holes 201. For example, in the fabrication method of the metal mask plate 20 provided by the embodiment of the present disclosure, a first opening 2013 and a second opening 2014 are formed by the via hole 201 on the first main surface S21 and the second main surface S22 of the metal substrate respectively, and an area of the second opening 2014 is larger than an area of the first opening 2013.

For example, in the fabrication method of the metal mask plate 20 provided by the embodiment of the present disclosure, the plurality of via holes 201 is formed, for example, by a chemical solution double-face etching method. Each via hole 201 is formed by coinciding and communicating the first sub-via hole H1 on the side of the first main surface S21 and a second sub-via hole H2 on the side of the second main surface S22. In an upward direction perpendicular to the metal mask plate 20, a hole diameter of the first sub-via hole H1 gradually increases and a hole diameter of the second sub-via hole H2 gradually decreases.

It is understood that, in the fabrication method of the metal mask plate 20 provided by the embodiment of the present disclosure, the forming method the via holes 201 and the shape of the via holes 201 formed are not limited. As described above, the via holes 201 may be formed, for example, by laser cutting, so as to have a trapezoidal cross section as a whole.

The fine metal mask plate fabricated by the fabrication method of the metal mask plate provided by the embodiment of the present disclosure can effectively avoid a wrinkle and deformation caused by the difference of the thicknesses during unfolding, so as to further effectively improve quality of the OLED display product fabricated by the fine metal mask plate.

Figure 10:
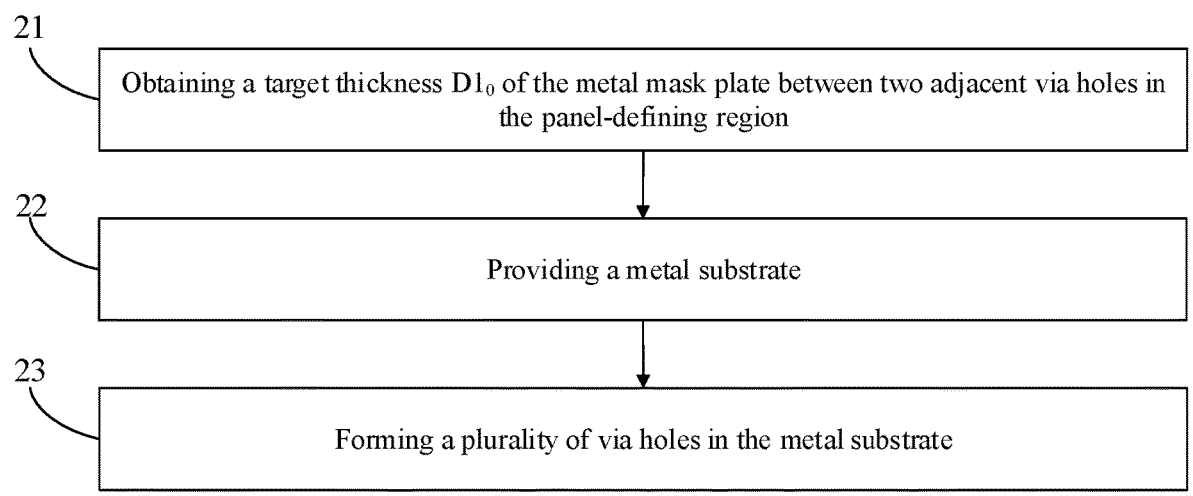
FIG. 10 is a flow chart of the fabrication method of the metal mask plate provided by an embodiment of the present disclosure.

An embodiment of the present disclosure further provides a fabrication method of a metal mask plate, the metal mask plate being configured for fabricating an organic light-emitting display panel. For example, the fabrication method of the metal mask plate is described by taking the metal mask plate shown in FIG. 4, FIG. 5 and FIG. 6 in the first embodiment as an example. The metal mask plate 20 is designed to include a plurality of via holes 201 that communicate a first main surface S21 and a second main surface S22 opposite to each other; the metal mask plate 20 is divided into a plurality of panel-defining regions 200 spaced apart and a main frame 210 portion surrounding each panel-defining region 200 and connecting the plurality of panel-defining regions 200; in each panel-defining region 200, the plurality of via holes 201 are arranged in a matrix, and side walls 202 of every two adjacent via holes 201 are directly connected with each other on the second main surface S22 of the metal substrate. As shown in FIG. 10, the fabrication method comprises steps of:

Step 21: obtaining a target thickness $D1_0$ of the metal mask plate 20 between two adjacent via holes 201 in the panel-defining region 200;

Step 22: providing a metal substrate configured for forming the metal mask plate 20, wherein a portion of the metal substrate for forming the main frame portion 210 of the metal mask plate 20 has a thickness D0, the thickness D0 and a thickness $D1_0$ satisfy $|D0-D1_0|/D1_0 \leq 20\%$.

Step 23: forming a plurality of via holes 201 in the metal substrate.

For example, in the fabrication method of the metal mask plate 20 provided by the embodiment of the present disclosure, a first opening P1 and a second opening P2 are formed by the via hole 201 respectively on the first main surface S21 and the second main surface S22 of the metal substrate, and an area of the second opening P2 is larger than an area of the first opening P1.

For example, as shown in FIG. 6 and FIG. 7, each via hole 201 is formed by coinciding and communicating a first sub-via hole H1 on a side of the first main surface S21 and a second sub-via hole H2 on a side of the second main surface S22. In an upward direction perpendicular to the metal mask plate 20, a hole diameter of the first sub-via hole H1 gradually increases and a hole diameter of the second sub-via hole H2 gradually decreases. In the above-described step 21, the target thickness $D1_0$ of the metal mask plate 20 between two adjacent via holes 201 is obtained according to a formula below, $$D1_0 = \frac{a \times \tan\theta}{2} + b$$

Where, a is a maximum transverse distance between the sidewalls 202, opposite to each other, of the two adjacent via holes 201 in the cross section, the cross section is perpendicular to the metal mask plate 20 and passes through centers of the two adjacent via holes 201; $\theta$ is a minimum incident angle by which the via hole 201 allows to pass through; and b is a vertical distance from a position where a hole diameter of the via hole 201 is the smallest to the first main surface S21. It is understood that, in the above formula, specific values of design parameters a, $\theta$ and b can be set when the metal mask plate 20 is designed, that is, before the plurality of via holes 201 are formed, the target thickness $D1_0$ of the metal mask plate 20 between the two adjacent via holes 201 can be known. According to an existing fabrication process, it can be achieved that the metal mask plate 20 fabricated substantially conforms to the above-described design parameters a, $\theta$ and b. Therefore, since the portion of the metal substrate provided in step 22 to form the main frame portion 210 of the metal mask plate 20 has the thickness D0, and the thickness D0 and the thickness $D1_0$ satisfy $|D0-D1_0|/D1_0 \le 20\%$, after the plurality of via holes 201 is formed, difference between the thickness the two adjacent via holes 201 of the metal mask plate 20 in the panel-defining region 200 and the thickness of the main frame portion 210 is within a range defined by the above formula, and it is possible to effectively avoid a wrinkle and deformation caused by the difference of the thicknesses during unfolding, so as to further effectively improve quality of an OLED display product fabricated by the fine metal mask plate.

For example, the portion of the metal substrate provided in step 22 to form the main frame portion 210 of the metal mask plate 20 has the thickness D0, and the thickness D0 and the thickness $D1_0$ satisfy $|D0-D1_0|/D1_0 \le 5\%$; furthermore, the portion of the metal substrate provided in step 22 to form the main frame portion 210 of the metal mask plate 20 has the thickness D0, and the thickness D0 is equal to the target thickness $D1_0$ of the metal mask plate 20 between the two adjacent via holes 201.

It is noted that, as shown in FIG. 8, the value of b in the above formula can be 0. When the value of b is 0, each via hole 201 is formed to have a trapezoidal cross section as a whole.

Similarly, in this embodiment, the via holes 201 can also be formed, for example, by a process such as double-sided chemical etching or laser cutting.

In addition, although in the above-described embodiment, in the step 21, the target thickness $D1_0$ of the metal mask plate 20 between the two adjacent via holes 201 within the panel-defining region is obtained according to a formula below:

$$D1_0 = \frac{a \times \tan\theta}{2} + b$$

However, in another example, in step 21, the target thickness $D1_0$ of the metal mask plate 20 between the two adjacent via holes 201 in the panel-defining region can further be obtained by measuring a corresponding thickness of the fine metal mask plate formed by a similar process and related parameters. A mode for obtaining the target thickness $D1_0$ is not limited by the embodiment of the present disclosure.

Although the present disclosure is described in detail hereinbefore with general illustration and specific embodiments, based on the embodiments of the present disclosure, certain amendments or improvements can be made thereto, which is obvious for those skilled in the art. Therefore, all such changes and improvements without departing from the spirit of the present disclosure are within the scope of the claims of the present disclosure.

The present application claims priority of Chinese Patent Application No. 201610007307.3 filed on Jan. 6, 2016, the present disclosure of which is incorporated herein by reference in its entirety as part of the present application.

The invention claimed is:

1. A metal mask plate configured for fabricating an organic light-emitting display panel, having a first main surface and a second main surface opposite to each other, the metal mask plate comprising:

a plurality of panel-defining regions spaced apart; and
a main frame portion, surrounding each of the panel-defining regions and connecting the plurality of panel-defining regions,
wherein, in each of the panel-defining regions, a plurality of via holes configured for defining a pixel structure are arranged in a matrix, and each of the via holes communicates the first main surface and the second main surface of the metal mask plate, side walls of every two adjacent via holes are directly contacted and connected with each other on the second main surface of the metal mask plate so that a vertical distance between the first main surface and the second main surface of the metal mask plate between the two adjacent via holes in the panel-defining region defines a first thickness D1, a vertical distance between the first main surface and the second main surface of the main frame portion defines a second thickness D2, and the first thickness D1 and the second thickness D2 satisfy $|D1-D2|/D1 \le 20\%$, and
wherein, the metal mask plate further comprises: a bonding portion provided coplanar with the main frame portion and connected with at least two opposite sides of the main frame portion, the bonding portion being configured for unfolded fixing the metal mask plate onto a support mechanism, and a thickness of the bonding portion being equal to the second thickness D2 of the main frame portion.

2. The metal mask plate according to claim 1, wherein, the first thickness D1 is equal to the second thickness D2.

3. The metal mask plate according to claim 1, wherein, both the first thickness D1 and the second thickness D2 are within a range of 5 μm to 40 μm.

4. The metal mask plate according to claim 3, wherein, both the first thickness D1 and the second thickness D2 are within a range of 10 μm to 25 μm.

5. The metal mask plate according to claim 1, wherein, each of the via holes in the metal mask plate forms a first opening and a second opening on the first main surface and the second main surface of the metal mask plate respectively, and an area of the second opening is larger than an area of the first opening.

6. The metal mask plate according to claim 5, wherein, each of the via holes is formed by a first sub-via hole on a first main surface side and a second sub-via hole on a second main surface side which are coincided and communicated, and in a direction perpendicular to the metal mask plate and from the second main surface to the first main surface, a hole diameter of the first sub-via hole gradually increases and a hole diameter of the second sub-via hole gradually decreases.

7. A fabrication method of the metal mask plate according to claim 1, comprising steps of:

providing a metal substrate, having a first main surface side and a second main surface side opposite to each other, wherein, the metal substrate is divided into a plurality of panel-defining regions spaced a part and a main frame region surrounding each of the panel-defining regions and connecting the plurality of panel-defining regions;

forming a plurality of via holes communicating the first main surface side and the second main surface side of the metal substrate in the metal substrate; and adjusting a thickness of the main frame region of the metal substrate, wherein, in each of the panel-defining regions, the plurality of via holes are configured for defining a pixel structure and are arranged in a matrix, and side walls of every two adjacent via holes are directly contacted and connected with each other on the second main surface side of the metal substrate so that a thickness D1 defined by a vertical distance between the first main surface and the second main surface of the metal substrate between the two adjacent via holes is formed to be smaller than a thickness D1' defined by the panel-defining region when the via holes begins to be formed, and a thickness of the main frame region of the metal substrate is adjusted so that a thickness D2 defined by a vertical distance between the first main surface and the second main surface of the main frame region after adjustment satisfies |D1−D2|/D1≤20%, the fabrication method further comprising:

providing a bonding portion coplanar with the main frame portion and connected with at least two opposite sides of the main frame portion, the bonding portion being configured for unfolded fixing the metal mask plate onto a support mechanism, and a thickness of the bonding portion being equal to the second thickness D2 of the main frame portion.

8. The fabrication method according to claim 7, wherein, the thickness D2 of the main frame region after adjustment satisfies |D1−D2|/D1≤5%.

9. The fabrication method according to claim 8, wherein, the thickness D2 of the main frame region after adjustment is equal to the thickness D1 of the metal substrate between two adjacent via holes.

10. The fabrication method according to claim 7, wherein, an original thickness of the panel-defining region is equal to an original thickness of the main frame region, and both are larger than or equal to 30 microns.

11. The fabrication method of the metal mask plate according to claim 7, wherein, the thickness D1 of the metal substrate between every two adjacent via holes is formed to be 33% to 75% of the thickness D1' of the panel-defining region when the via hole begins to be formed.

12. The fabrication method according to claim 7, wherein, the step of adjusting a thickness of the main frame region of the metal substrate is performed by thinning the main frame portion of the metal substrate, after forming a plurality of via holes communicating the first main surface side and the second main surface side of the metal substrate in the metal substrate, so that the main frame region has the thickness D2 after the thinning.

13. The fabrication method according to claim 7, wherein, the main frame region is adjusted to have the thickness D2 before formation of the plurality of via holes.

14. The fabrication method according to claim 7, wherein, the via hole forms a first opening and a second opening respectively on the first main surface and the second main surface of the metal substrate, and an area of the second opening is larger than an area of the first opening.

15. The fabrication method according to claim 14, wherein, the plurality of via holes is formed by a chemical solution double-face etching method.

16. The fabrication method according to claim 15, wherein, each of the via holes is formed by coinciding and communicating a first sub-via hole on the first main surface side and a second sub-via hole on the second main surface side, and in a direction perpendicular to the metal mask plate and from the second main surface to the first main surface, a hole diameter of the first sub-via hole gradually increases and a hole diameter of the second sub-via hole gradually decreases.

17. The fabrication method of the metal mask plate according to claim 7, further comprising steps of:

obtaining a target thickness $D1_0$ defined by a vertical distance between the first main surface and the second main surface of the metal mask plate between two adjacent via holes in the panel-defining region; and providing a metal substrate to form the metal mask plate, wherein a portion of the metal substrate for forming the main frame portion of the metal mask plate has a thickness D0, the thickness D0 and the thickness $D1_0$ satisfy $|D0-D1_0|D1_0 \leq 20\%$; and forming the plurality of via holes in the metal substrate.

18. The fabrication method according to claim 17, wherein, the via hole forms a first opening and a second opening on the first main surface and the second main surface of the metal substrate respectively, and an area of the second opening is larger than an area of the first opening.

19. The fabrication method according to claim 17, wherein, the target thickness $D1_0$ of the metal mask plate between two adjacent via holes is obtained according to formula $$D1_0 = \frac{a \times \tan\theta}{2} + b,$$

where, a is a maximum transverse distance between the sidewalls, opposite to each other, of the two adjacent via holes in a cross section, the cross section is perpendicular to the metal mask plate and passes through centers of the two adjacent via holes; θ is a minimum incident angle by which the via hole allows to pass through, and b is a vertical distance from a position where a hole diameter of the via hole is the smallest to the first main surface.

* * * * *